United States Patent
Nguyen et al.

(10) Patent No.: US 11,156,548 B2
(45) Date of Patent: Oct. 26, 2021

(54) MEASUREMENT METHODOLOGY OF ADVANCED NANOSTRUCTURES

(71) Applicant: KLA-TENCOR CORPORATION, Milpitas, CA (US)

(72) Inventors: Manh Nguyen, Sunnyvale, CA (US); Phillip Atkins, San Jose, CA (US); Alexander Kuznetsov, Austin, TX (US); Liequan Lee, Fremont, CA (US); Natalia Malkova, Mountain View, CA (US); Paul Aoyagi, Sunnyvale, CA (US); Mikhail Sushchik, Pleasanton, CA (US); Dawei Hu, Shanghai (CN); Houssam Chouaib, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 722 days.

(21) Appl. No.: 15/938,270

(22) Filed: Mar. 28, 2018

(65) Prior Publication Data

US 2019/0178788 A1   Jun. 13, 2019

Related U.S. Application Data

(60) Provisional application No. 62/596,598, filed on Dec. 8, 2017.

(51) Int. Cl.
*G01N 21/21* (2006.01)
*G01B 11/06* (2006.01)
(Continued)

(52) U.S. Cl.
CPC ........ *G01N 21/211* (2013.01); *G01B 11/0625* (2013.01); *G01B 11/0641* (2013.01);
(Continued)

(58) Field of Classification Search
CPC .............. G01N 21/211; G01B 11/0625; G01B 11/0641; G03F 7/70625; G05B 13/024
See application file for complete search history.

(56) References Cited

U.S. PATENT DOCUMENTS

| | | | |
|---|---|---|---|
| 5,608,526 A | 3/1997 | Piwonka-Corle et al. |
| 5,859,424 A | 1/1999 | Norton et al. |

(Continued)

FOREIGN PATENT DOCUMENTS

| | | |
|---|---|---|
| WO | 2014062972 A1 | 4/2014 |
| WO | 2017052627 A1 | 3/2017 |
| WO | 2018075551 A1 | 4/2018 |

OTHER PUBLICATIONS

Born et al., Principles of Optics, Chapter 1, 1970.
(Continued)

*Primary Examiner* — Bijan Mapar
(74) *Attorney, Agent, or Firm* — Hodgson Russ LLP

(57) ABSTRACT

A parameterized geometric model of a structure can be determined based on spectra from a wafer metrology tool. The structure can have geometry-induced anisotropic effects. Dispersion parameters of the structure can be determined from the parameterized geometric model. This can enable metrology techniques to measure nanostructures that have geometries and relative positions with surrounding structures that induce non-negligible anisotropic effects. These techniques can be used to characterize process steps involving metal and semiconductor targets in semiconductor manufacturing of, for example, FinFETs or and gate-all-around field-effect transistors.

20 Claims, 6 Drawing Sheets

(51) Int. Cl.
*G03F 7/20* (2006.01)
*G05B 13/02* (2006.01)

(52) U.S. Cl.
CPC ....... *G03F 7/70625* (2013.01); *G05B 13/024* (2013.01); *G01B 2210/56* (2013.01); *G01N 2021/213* (2013.01)

(56) References Cited

U.S. PATENT DOCUMENTS

| | | | |
|---|---|---|---|
| 6,429,943 | B1 | 8/2002 | Opsal et al. |
| 7,478,019 | B2 | 1/2009 | Zangooie et al. |
| 7,929,667 | B1 | 4/2011 | Zhuang et al. |
| 7,933,026 | B2 | 4/2011 | Opsal et al. |
| 8,798,966 | B1 | 8/2014 | Hench et al. |
| 9,915,522 | B1 | 3/2018 | Jiang et al. |
| 2007/0091317 | A1* | 4/2007 | Freischlad ........... G01B 9/0209 356/511 |
| 2011/0246400 | A1* | 10/2011 | Li ........................ G01B 11/24 706/12 |
| 2012/0037217 | A1 | 2/2012 | Hamam et al. |
| 2012/0226644 | A1 | 9/2012 | Jin et al. |
| 2013/0066597 | A1* | 3/2013 | Van Beurden ...... G03F 7/70625 703/1 |
| 2013/0083320 | A1 | 4/2013 | Gao et al. |
| 2014/0019097 | A1 | 1/2014 | Bakeman et al. |
| 2014/0111791 | A1 | 4/2014 | Manassen et al. |
| 2014/0172394 | A1 | 6/2014 | Kuznetsov et al. |
| 2014/0222380 | A1 | 8/2014 | Kuznetsov et al. |
| 2015/0117610 | A1 | 4/2015 | Veldman et al. |
| 2015/0204664 | A1 | 7/2015 | Bringoltz et al. |
| 2016/0202193 | A1 | 7/2016 | Hench et al. |
| 2016/0216197 | A1 | 7/2016 | Bringoltz et al. |
| 2017/0167862 | A1 | 6/2017 | Dziura et al. |
| 2018/0059019 | A1 | 3/2018 | Chouaib et al. |
| 2019/0017946 | A1 | 1/2019 | Wack et al. |
| 2019/0041266 | A1 | 2/2019 | Wang et al. |

OTHER PUBLICATIONS

Landau et al., Electrodynamics of Continuous Media, Sections 78-79, 1984.
ISA/KR, International Search Report and Written Opinion for PCT/US2018/064369 dated Apr. 29, 2019.
Manghi et al., Anisotropy of surface optical properties from first-principles calculations, Physical Review B, vol. 41, No. 14, pp. 9935-9946, 1990.
Lekner, Reflection and refraction by uniaxial crystals, Journal of Physics: Condensed Matter, vol. 3, No. 32, pp. 6121-6133, 1991.

* cited by examiner

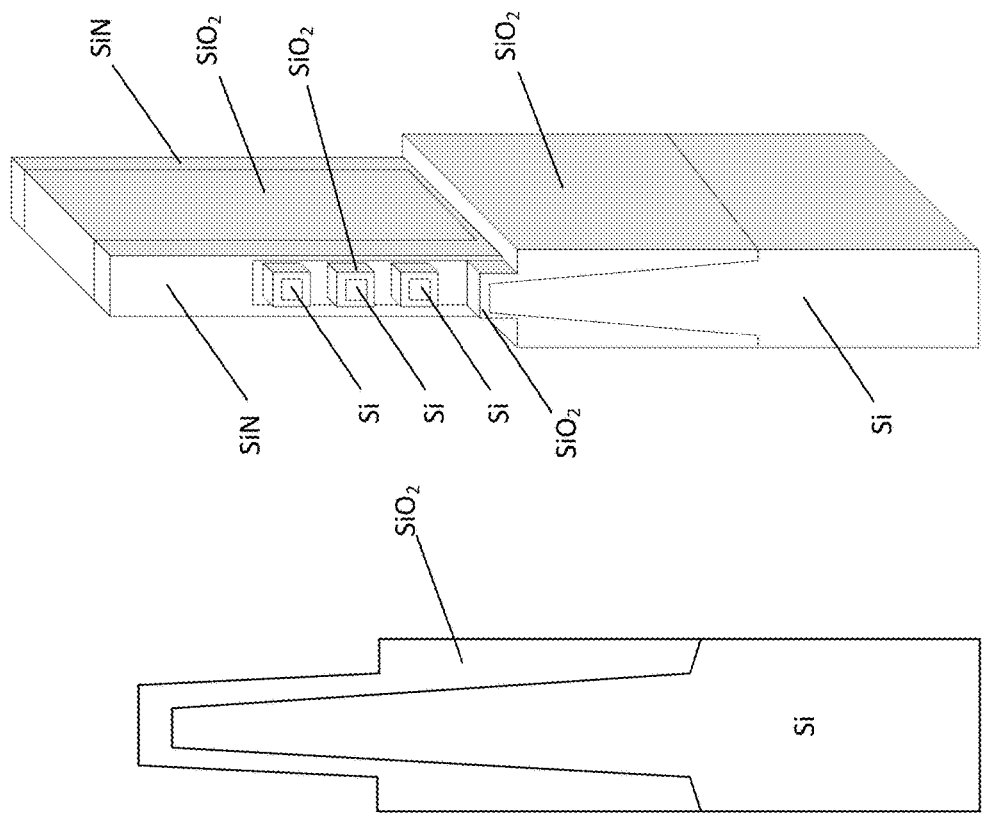
FIG. 7
FIG. 6
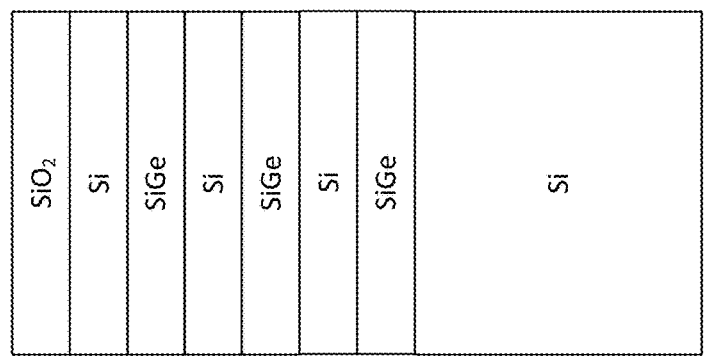
FIG. 5

MEASUREMENT METHODOLOGY OF ADVANCED NANOSTRUCTURES

CROSS-REFERENCE TO RELATED APPLICATIONS

This application claims priority to the provisional patent application filed Dec. 8, 2017 and assigned U.S. App. No. 62/596,598, the disclosure of which is hereby incorporated by reference.

FIELD OF THE DISCLOSURE

This disclosure relates to measuring structures on a semiconductor wafer.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Metrology may be used during semiconductor manufacturing to take various measurements of, for example, a semiconductor wafer or reticle. Metrology tools can be used to measure structural and material characteristics associated with various semiconductor fabrication processes. For example, the metrology tools can measure material composition or can measure dimensional characteristics of structures and films such as film thickness, critical dimension (CD) of structures, or overlay. These measurements are used to facilitate process controls and/or yield efficiencies during the manufacture of semiconductor dies.

As semiconductor device pattern dimensions continue to shrink, smaller metrology targets are often required. Furthermore, the requirements for measurement accuracy and matching to actual device characteristics increase the need for device-like targets as well as in-die and even on-device measurements. Various metrology implementations have been proposed to achieve that goal. For example, focused beam ellipsometry based on primarily reflective optics has been proposed. Apodizers can be used to mitigate the effects of optical diffraction causing the spread of the illumination spot beyond the size defined by geometric optics. The use of high-numerical-aperture tools with simultaneous multiple angle-of-incidence illumination is another way to achieve small-target capability.

Other measurement examples may include measuring the composition of one or more layers of the semiconductor stack, measuring certain defects on (or within) the wafer, and measuring the amount of photolithographic radiation exposed to the wafer. In some cases, a metrology tool and algorithm may be configured for measuring non-periodic targets.

Metrology techniques can characterize parameters of a semiconductor wafer during a manufacturing process. In practice, light is directed onto a periodic grating formed in a semiconductor wafer. Spectra of reflected light is measured and analyzed to characterize the grating parameters. Characterization parameters may include CD, sidewall angle (SWA), feature height (HT), material parameters, or other parameters, which affect the polarization and intensity of the light reflected from or transmitted through a material. Analysis of measured spectra generally involves comparing the measured sample spectra to simulated spectra to deduce a model's parameter values that best describe the measured sample.

Measurement of parameters of interest usually involves multiple algorithms. For example, optical interaction of the incident beam with the sample is modeled using an electromagnetic (EM) solver and uses such algorithms as rigorous coupled wave analysis (RCWA), finite element modeling (FEM), method of moments, surface integral method, volume integral method, or finite-difference time domain (FDTD). The target of interest is usually modeled (e.g., parametrized) using a geometric engine, a process modeling engine, or a combination of both. A geometric engine is implemented, for example, in the AcuShape software product from KLA-Tencor.

These modeling methods can include modification of fixed or floated parameters; modification of parameter constraint; modification of nominal value of fixed parameters; modification of coordinates of parameter space; selection or weighting of a subsystem or channel; wavelength selection or weighting; multi-pass; data feedforward; multi-model; or modification of a regression engine.

A component of semiconductor metrology for in-device or device-like targets is the modeling of the optical interaction of an incident beam with the sample using an electromagnetic solver. Examples of electromagnetic solvers include RCWA, FEM, method of moments, surface integral method, volume integral method, or FDTD. These simulation algorithms rely on pre-determined dispersions of individual components of the measurement targets.

There are at least two assumptions regarding the dispersion of a target. First, the dispersion of a target is often assumed to be a small deviation from the bulk dispersion of the same material, which may be due to process variation, temperature variation, or other parameters. Second, the dispersion of many materials commonly used in semiconductor manufacturing is assumed to be independent of the polarization of the incoming light. Previously, a metrology system, such as a spectroscopic ellipsometer, was used for measurements. Film stacks, in-device, or device-like 2D and 3D structures from an intermediate or final process step were measured. One isotropic dispersion model was usually used to describe the optical property of each component of the targets. Algorithms then estimated the parameters of interest based on the measured and simulated signals.

These two assumptions are not valid for dispersions of target structures whose geometries together with their relative positions to other structures induce non-negligible anisotropic effects. For example, in a sufficiently thin SiGe film or in a 2D or 3D SiGe nanostructure, strain/stress-induced anisotropy can become a dominant factor in its optical property. In another example, in a sufficiently small-sized Si fin in a FinFET, the relative relationship between Si lattice orientation such as (100), (110), (111) and the geometry of the channel can introduce different types of anisotropy. As the target structures of the next generation of thin FinFETs or gate-all-around FETs become more sophisticated in their designs of both composite materials and geometries (such as size, shape, material interface, etc.), the current approach will not be able to accommodate all the necessary measurement steps to ensure high measure quality, and consequently to ensure high yields. Furthermore, the current ultraviolet, visible, and infrared types of incoming electromagnetic waves may not be able to provide sufficient signatures for the targets that are near the bottom of a relatively thick structure.

Therefore, new systems and methods to measure structures on a semiconductor wafer are needed.

BRIEF SUMMARY OF THE DISCLOSURE

In a first embodiment, a method is provided. Spectra, which are measured by a wafer metrology tool, are received at a processor. The spectra are from an area of a semiconductor wafer that includes a structure. The structure has geometry-induced anisotropic effects. A parameterized geometric model of the structure is generated using the processor. Anisotropic material properties are assigned to the parameterized geometric model using the processor. Dispersion parameters of the structure on the wafer are determined using the parameterized geometric model with the processor. The dispersion parameters include anisotropic dispersion parameters. At least one geometric parameter or anisotropic material parameter is determined from the parameterized geometric model using the processor.

The spectra may be measured with the wafer metrology tool.

The dispersion parameters can include an anisotropic tensor matrix.

The anisotropic dielectric components of the dispersion parameters may be provided by reference theoretical or empirical dispersion models. In an instance, the reference theoretical or empirical dispersion models represent dependency of the dispersion parameters on contributing factors to anisotropy.

The at least one geometric parameter or the anisotropic material parameter may be determined using a regression or machine learning.

The dispersion parameters can be modeled using a biaxial model or a uniaxial model. In an instance, dielectric components of the biaxial model or the uniaxial model are provided by at least one reference dispersion model.

The anisotropic material properties can include at least one of electron density, material density, or chemical composition.

The anisotropic dispersion parameters can be parametrized using correction parameters. In an instance, the correction parameters represent shifts or scales of an original anisotropic dispersion.

In an instance, the dispersion parameters are determined by a process including generating a spectral design of experiments using the parameterized geometric model, a dispersion model, and a simulator; training a statistical model to determine a relationship between the spectra and at least one parameter related to geometric and/or material parameters of the structure; and predicting parameters of interest of the structure from the spectra using the statistical model. At least one of the geometric parameters and dispersion parameters are distributed within predetermined ranges.

The dispersion parameters can be determined by at least one of optimization or regression minimizing a spectral difference between modeled and measured versions of the spectra and by perturbing the parameterized geometric model and the dispersion parameters.

The method can further include one or more feedback operations that use learning based upon comparing simulated spectra and the spectra to adjust parameters in the parameterized geometric model, a dispersion model, and/or a geometric configuration.

The method can further include predicting anisotropic dispersions using the spectra.

A computer program product comprising a non-transitory computer readable storage medium having a computer readable program embodied therewith can be provided. The computer readable program is configured to carry out one of the variations of the method of the first embodiment.

In a second embodiment, a system is provided. The system includes an electronic data storage unit and a processor in electronic communication with the electronic data storage unit and a wafer metrology tool. The processor is configured to generate a parameterized geometric model of a structure; assign anisotropic material properties to the parameterized geometric model; determine dispersion parameters of the structure on the wafer using the parameterized geometric model; and determine at least one geometric parameter or anisotropic material parameter from the parameterized geometric model. The spectra are from an area of a semiconductor wafer that includes a structure and are measured by a wafer metrology tool. The structure has geometry-induced anisotropic effects. The dispersion parameters include anisotropic dispersion parameters.

In an instance, the processor and the electronic data storage unit may be disposed in or otherwise part of the wafer metrology tool.

In a third embodiment, a simulator is provided. The simulator comprises a parameterized geometric model of a structure. The spectra are from an area of a semiconductor wafer that includes a structure and are measured by a wafer metrology tool. The structure has geometry-induced anisotropic effects. The parameterized geometric model, using a processor, is configured to have anisotropic material properties assigned; determine dispersion parameters of the structure on the wafer; determine at least one geometric parameter or anisotropic material parameter; and predict anisotropic dispersions based on the spectra. The dispersion parameters include anisotropic dispersion parameters.

DESCRIPTION OF THE DRAWINGS

For a fuller understanding of the nature and objects of the disclosure, reference should be made to the following detailed description taken in conjunction with the accompanying drawings, in which:

FIG. 5 illustrates an exemplary film stack;

FIG. 6 illustrates an exemplary FinFET;

FIG. 7 illustrates an exemplary gate-all-around (GAA) FET; and

DETAILED DESCRIPTION OF THE DISCLOSURE

Figure 1:
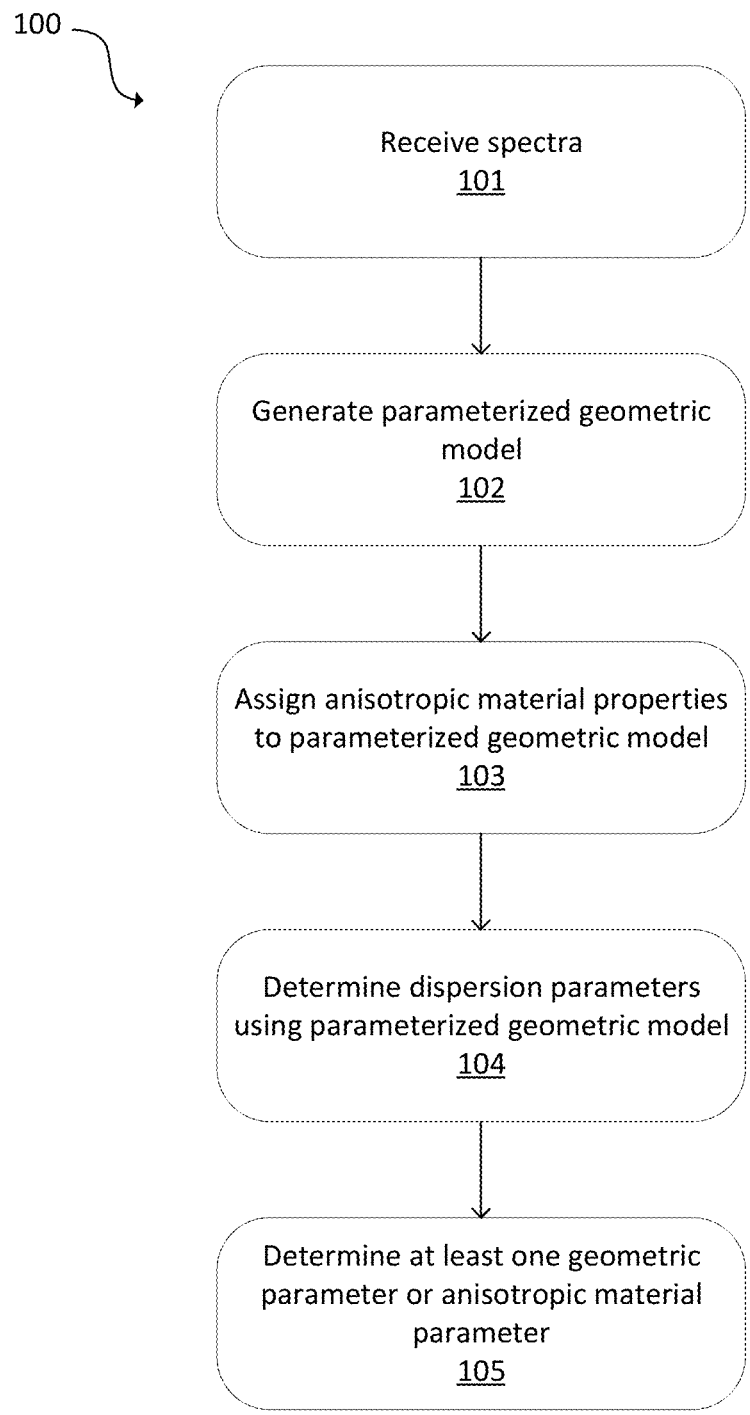
FIG. 1 is a flowchart of a first embodiment of a method in accordance with the present disclosure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can enable metrology techniques to measure nanostructures that have geometries and relative positions with surrounding structures that induce non-negligible anisotropic effects. For example, the non-negligible anisotropic effects may include material properties that are changed by more than 0.1% as compared to their values for bulk materials. In another example, the non-negligible anisotropic effects may include changes in simulated signal more than a tolerance. The tolerance may be, for example, 5%. Geometry-induced anisotropy-based simulated signals (e.g., more than a tolerance such as 5%) may be more accurate than those based on isotropic-assumed material. These techniques can be used to characterize process steps involving metal and semiconductor targets in semiconductor manufacturing of, for example, advanced FinFETs or gate-all-around (GAA) FETs. Using embodiments disclosed herein, physical properties can be connected with dimensional properties. Thus, geometric parameters affecting the material properties can be connected to dimensional properties. Shapes and/or relative positions of structures can be accounted for.

A wafer metrology tool may provide spectroscopic ellipsometry (SE). Such a wafer metrology tool typically includes a broadband light source, a system that measures how the light source interacts with the target, and processing algorithms that extract the relevant parameters of the target. The source might be a laser driven light source, which can provide high intensities and increase the signal-to-noise ratio at the detector, as opposed to a Xe lamp. In an example, the collection system includes a series of polarizers (rotating or fixed), compensators (rotating or fixed), detectors, spectrometers, cameras, lenses, mirrors, and/or collimators. To enhance target signatures, the system may use $N_2$ or Ar gas purge to extend the wavelength range to 170 nm or below.

For SE measurements, optical properties of measurement targets are used to simulate the light-target interaction. When complexity of material and geometric design of a target structure become highly sophisticated and/or when structure size becomes sufficiently small, its optical property can strongly deviate from that of the bulk material. In such a case, anisotropy effects can become significant and/or dispersion becomes notably different from that of the bulk material. This phenomenon is referred to as geometry-induced anisotropy.

Geometry-induced anisotropy can include any anisotropy effect in a target structure that is directly or indirectly caused by the geometry of the target structure, geometries of surrounding structures, and/or the relative position of the target structure and those of surrounding structures. Geometry of the target structure can include shape, size, structural symmetries, intrinsic anisotropy of crystals, strain-induced anisotropy, stress-induced anisotropy, neighboring structures (proximity effect), quantum tunneling effects, quantization effects, hydrogen passivation, or other parameters. These parameters can become non-negligible due to the involvement of the geometries of the structures. In an instance, geometry of a target structure includes a thickness of a layer of interest (e.g., $SiO_2$, Si, or SiGe). Geometry of a surrounding structure can include a thickness of a neighboring layer of the layer of interest. An example of relative position of the target structure and the surrounding structure can be seen in FIG. 5. The top Si layer is between a $SiO_2$ layer and a SiGe layer, while the second top Si is between two Si layers.

In an instance, geometry-induced anisotropy can include effects due to electrostatic mismatch (e.g., image forces) in wires with a dielectric constant different from an ambient medium.

In an instance, geometry-induced anisotropy can include process variations such as annealing or underlying edging technologies.

In an instance, surface/interface induced anisotropy is included in the geometry-induced anisotropy. Surface/interface anisotropy can appear due to local surface fields, intrinsic surface/interface states, and/or intrinsic relaxation of the surface/interface atomic layers.

When a target structure is anisotropic, the target structure's dielectric function can be represented as a full tensor permittivity matrix. This full tensor form can be referred to as an anisotropic model.

To help account for the geometry-induced anisotropy and deviation from bulk properties for a given target structure, techniques to predict the affected dispersions are disclosed. In an instance, the dispersions are measured using a wafer metrology tool on simpler or similar targets. For example, measured dispersions of thin films can be used as a first estimate for small structures in FinFETs, GAA FETs, or similar targets. In a second instance, material simulators that are based on, but not limited to, theoretical, semi-empirical, and/or empirical methods are used to predict the presence of the effects of geometry-induced anisotropy and dispersion deviation in dispersions of target structures. In a third instance, simpler or similar targets are measured and a material simulator is used.

SE relies on optical interaction between ultraviolet, visible, or infrared light and targets. However, optical wavelengths may fail to provide sufficient measurement accuracy. In some cases, X-ray metrology (such as critical-dimension small-angle X-ray scattering (CD-SAXS) or specular X-ray reflectivity (SXR) can be used for measurements of critical parameters. Accuracy of X-ray metrology depends on material properties (such as material or electron density). For example, the electron density of a material may be heavily affected by the anisotropic effects which cause changes in the material's energy levels. By properly accounting for changes in material properties, the accuracy of X-ray metrology may be improved. The methodology may work for X-rays in a similar matter to optical techniques. However, material properties for an optical technique are described by n and k, whereas electron density can be used to describe material properties for an X-ray metrology.

Similar to optical, errors in material properties in X-rays will degrade the accuracy of the measurements. Having more accurate material properties (e.g. electron density) will improve measurement accuracy of geometric parameters FIG. 1 is a flowchart of a method 100. The disclosed combination of metrology tools and methods can model the geometry-induced anisotropy of small-sized nano structures including, but not limited to, thin film stacks, FinFETs, GAA FETs, and future generations of DRAM and 3D flash memory structures.

At 101, spectra are received at a processor. The spectra may be SE spectra or may be X-ray spectra. The spectra are from an area of a semiconductor wafer that includes a structure. The structure may have geometry-induced anisotropic effects. The spectra are measured by a wafer metrology tool. In an instance, the spectra are measured with the wafer metrology tool and the spectra are communicated to the processor.

At 102, a parameterized geometric model of the structure is generated using the processor. The parameterized geometric model may be based on the spectra or may be based on other techniques. This may be based on predetermined geometry-induced anisotropic dispersion models, which may include measured and/or simulated geometry-induced anisotropic dispersions.

A parametrized geometric model can be referred to as the geometric configuration of a guess of the target structure. After the geometric configuration (e.g., parameterized geometric model) is determined, pre-determined and/or parameterized material properties (e.g., n and k) can be assigned to different sub-structures of the structures.

Using a predetermined dispersion model or dispersion library may be better than an existing dispersion model or dispersion library in some instances because an operator may use new dispersion models generated by the operator. In practice, parametrized geometric models are often generated based on knowledge provided by semiconductor manufacturers about the target structures.

In an instance, step 102 includes generating a parameterized geometric model of the structure and one or more dispersion models. This may be performed by one processor or different processors.

Anisotropic material properties are assigned to the parameterized geometric model using the processor at 103. The anisotropic material properties can include at least one of electron density, material density, or chemical composition. These anisotropic material properties may be geometry-induced. While anisotropic material properties are disclosed, other types of material properties are possible. In an instance, assigning the anisotropic material properties can mean indicating which sub-structures in the geometric model have which materials. For example, in FIG. 5, before assigning materials, the geometric model consists of geometric blocks one over another. After assigning materials the top block is understood to be $SiO_2$, second is Si, and so on.

Turning back to FIG. 1, using the processor, dispersion parameters of the structure on the wafer are determined using the parameterized geometric model at 104. This may use a biaxial model or a uniaxial model. Dielectric components of the biaxial model or the uniaxial model can be provided by at least one reference dispersion model. The biaxial model or uniaxial model can be solved manually by a user. For example, when a structure is a very thin film, users may use a uniaxial dispersion model. In another example, when a structure is a nanowire of small size, users may use a biaxial dispersion model.

The dispersion parameters can include anisotropic dispersion parameters. In an instance, the dispersion parameters include an anisotropic tensor matrix. The anisotropic dispersion parameters may parametrized using correction parameters, which can represent shifts or scales of an original anisotropic dispersion.

In a particular embodiment, a 3×3 tensor matrix is used with the dispersion parameters. This may be a diagonal tensor.

Anisotropic dielectric components of the dispersion parameters can be provided using reference theoretical or empirical dispersion models. The reference theoretical or empirical dispersion models can represent dependency of the dispersion parameters on contributing factors to anisotropy.

The dispersion parameters can be determined by at least one of optimization or regression minimizing a spectral difference between modeled and measured versions of the spectra and by perturbing the parameterized geometric model and the dispersion parameters.

In an embodiment, the dispersion parameters can be determined by the following process. First, a spectral design of experiments is generated using the parameterized geometric model, a dispersion model, and a simulator. The dispersion model may be a pre-determined dispersion model or a parameterized dispersion model. Material parameters from the parameterized dispersion model together with geometric parameters can be varied to output simulated signals. The simulator may be an EM solver, such as RCWA, FEM, or finite volume method (FVM).

At least one of the geometric parameters and dispersion parameters can be distributed within predetermined ranges. Second, a statistical model is trained to determine a relationship between the spectra and at least one parameter related to geometric and/or material parameters of the structure. Finally, parameters of interest of the structure are predicted from the spectra using the statistical model.

At 105, at least one of geometric parameters or anisotropic material parameters are determined from the parameterized geometric model using the processor. At least one of the geometric parameters or the anisotropic material parameters can be determined using a regression or machine learning. In an instance, material parameters can be used to determine bandgap or electron transport properties, which can be further used to predict device performance prediction.

Parameters of anisotropic dispersions can be predicted using the spectra.

In an instance, one or more feedback operations that use learning based upon comparing simulated spectra and the spectra can be used to adjust parameters in the parameterized geometric model, a dispersion model, and/or a geometric configuration.

The embodiments disclosed herein, including that of FIG. 1, can be used to measure thin semiconductor, films, metal films, semiconductor nanowires, metal nanowires, semiconductor fins, and/or metal fins that are a component of logic devices, such as GAA FETs or FinFETs, or memory structures, such as DRAM, spin-transfer torque RAM (STT-RAM), or 3D NAND.

In an example, a Cartesian coordinate system is placed on a wafer such that the z axis is normal to the wafer's surface. It can be assumed that thin films are deposited in the x-y plane and that cylindrical or rectangular nanowires or fins are positioned such that their symmetric axes are parallel to the x, y, and z axes.

Thin semiconductor or metal films can accommodate anisotropy using a uniaxial dispersion model which has one dielectric component representing the optical response in the z direction, and another for the material response in x-y plane. The model for each component can be taken from a pre-determined theoretical, semi-empirical, and/or empirical dispersion library or model. The library or model can include parameters determining its dependency on various anisotropy effects such as % Ge and/or stress/strain variations in SiGe. The uniaxial dispersion model using such dispersion libraries can be referred to as a composite dispersion model.

For example, as seen in FIG. 5, anisotropy of the first Si layer (between $SiO_2$ and SiGe) can be different from the third-from-top Si layer (between SiGe and SiGe). Both of them may depend on thickness of their neighboring layers.

For semiconductor or metal nanowires or fins, the anisotropy due to size restrictions in the x, y, and/or z directions with or without indirect or direct contributions of other anisotropic effects besides size restriction can be represented by a diagonalized permittivity tensor. In the diagonal form, the three directional permittivity components correspond to the responses of the nanowires upon incoming electric fields whose direction is parallel to each of the x, y, or z axes. In order to accommodate the anisotropy, similar to the case of thin films, a composite dispersion model based on the biaxial model that has three dielectric components may be used. Each of the dielectric components can be taken from a pre-determined theoretical, semi-empirical, and/or empirical dispersion library or model.

Figure 2:
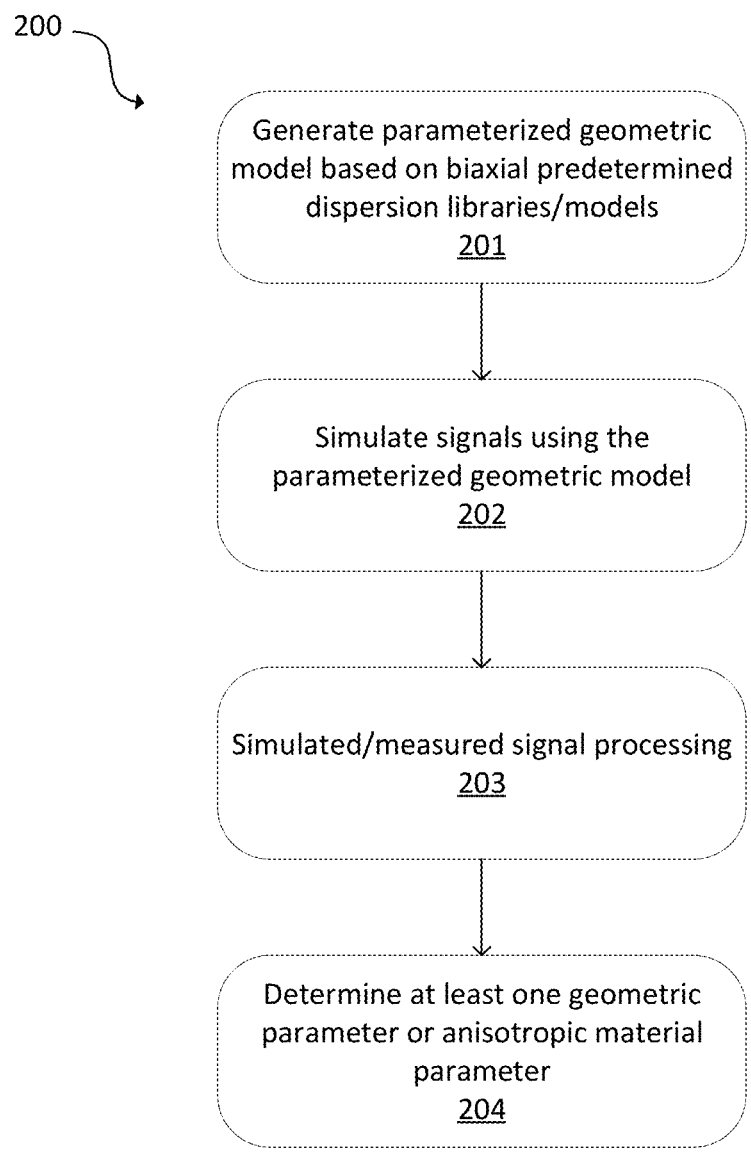
FIG. 2 is a flowchart of a second embodiment of a method in accordance with the present disclosure.

This can be seen in the flowchart of method 200 in FIG. 2. At 201, a parameterized geometric model is generated based on biaxial predetermined dispersion libraries or models, such as those for small-sized nanostructures. Measured and/or simulated composite dispersions may be used to generate the parameterized geometric model. At 202, signals are simulated using the parameterized geometric model and/or a simulator. At 203, the simulated signals and any measured signals from a wafer are processed, such as using a regression or machine learning. At 204, at least one parameter of interest, such as a geometric parameter or an anisotropic material parameter, is determined.

In this and other embodiments disclosed herein, signals can be some form of a reflected or transmitted electromagnetic field. Given a geometric model of a structure, together with dispersion properties (e.g., n and k) of different parts of the structure, an EM solver (RCWA, FEM, etc.) can solve the Maxwell equation and/or some form of the Schrodinger equations. Such a solution can then be used to derive simulated signals.

The signals may be processed using regression or machine learning. Regression can be used to minimize an error function (e.g., a square of differences between simulated and measured signals) over the space of unknown parameters (e.g., geometric parameters, material parameters, other parameters). In an example, the unknown parameters are repeatedly guessed until simulated spectra and measured spectra are sufficiently matched. In an example of machine learning, a model can be trained based on a simulator that can output unknown parameters from a given spectra. Once the model is available, feeding a measured spectra to the model can output resulting values for unknown parameters.

In another embodiment of the nano structure measurement, correction terms are added to the pre-determined anisotropic dispersions. Possible correction terms include, but are not limited to, shift and scale parameters which are used to correct errors in the pre-measured or pre-simulated dispersions.

Figure 3:
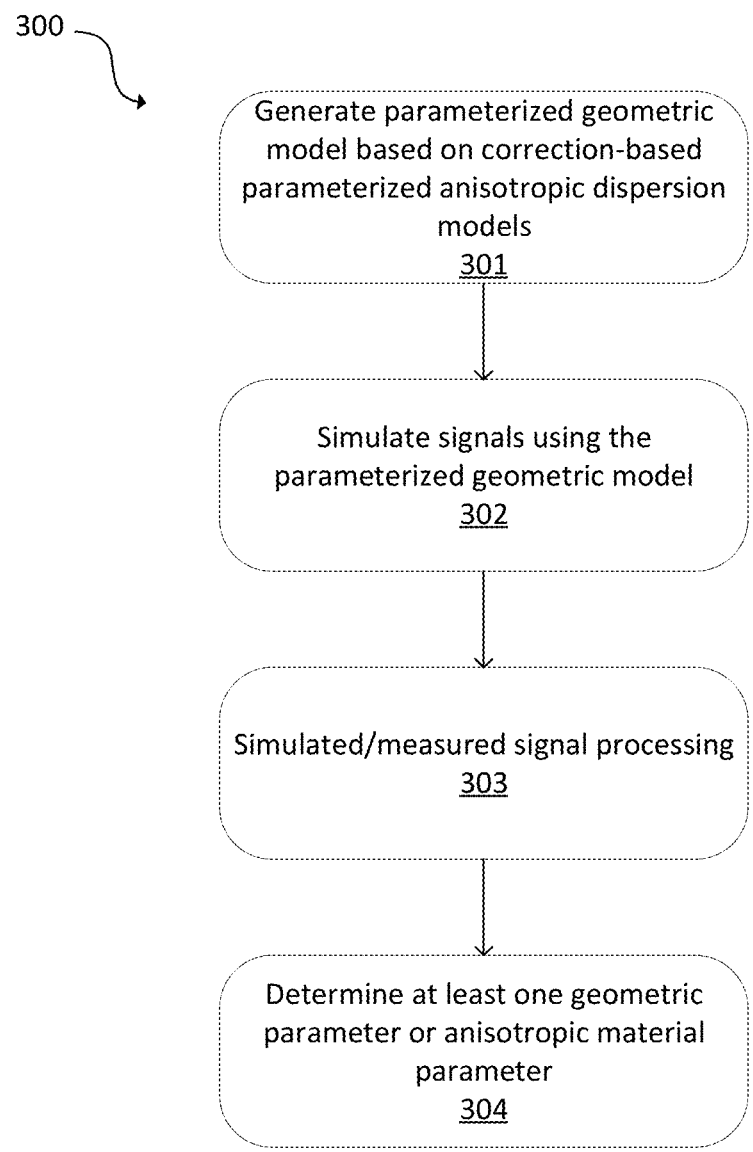
FIG. 3 is a flowchart of a third embodiment of a method in accordance with the present disclosure.

This can be seen in the flowchart of method 300 in FIG. 3. At 301, a parameterized geometric model is generated using correction-based parameterized anisotropic dispersion models for nanostructures. Measured and/or simulated anisotropic dispersions may be used to generate the parameterized geometric model. At 302, signals are simulated using the parameterized geometric model and/or a simulator. At 303, the simulated signals and any measured signals from a wafer are processed, such as using a regression or machine learning. At 304, at least one parameter of interest, such as a geometric parameter or an anisotropic material parameter, is determined. Corrected simulated dispersions also can be determined.

The correction terms can be obtained as a result of regression and/or machine learning over both the parameters of interest (such as geometric, material, system parameters) and the correction terms.

Figure 4:
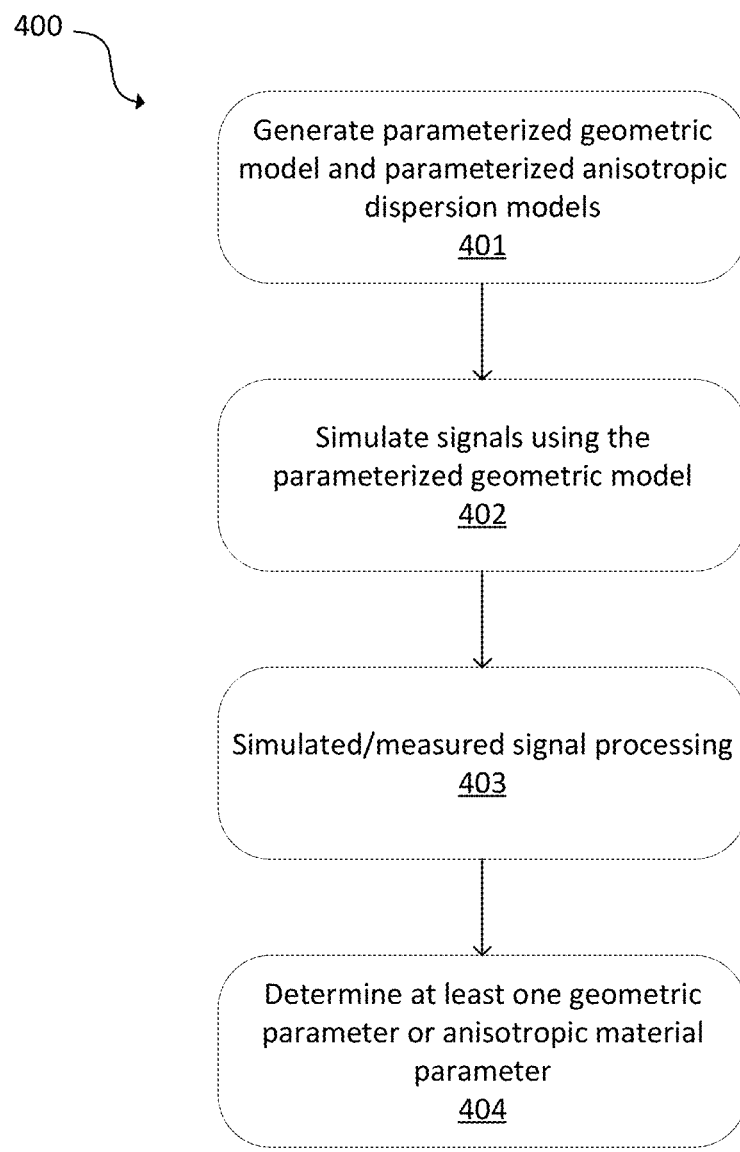
FIG. 4 is a flowchart of a fourth embodiment of a method in accordance with the present disclosure.

In another embodiment of the nanostructure measurement, regression and/or machine learning is used on the parameters unrelated to material (such as geometric and/or system parameters) and the dispersion parameters of the anisotropic dispersion models representing the nano structures' dispersions. An instance of a dispersion library/model may not be needed and any reasonable estimated dispersion can be used as the initial dispersion for the regression. This can be seen in the flowchart of method 400 in FIG. 4. At 401, a parameterized geometric model and/or parameterized anisotropic dispersion model is generated. Initial anisotropic dispersions may be used to generate the parameterized geometric model and/or parameterized anisotropic dispersion model. At 402, signals are simulated using the parameterized geometric model, parameterized anisotropic dispersion model, and/or a simulator. At 403, the simulated signals and any measured signals from a wafer are processed, such as using a regression or machine learning. At 404, at least one parameter of interest, such as a geometric parameter or an anisotropic material parameter, is determined. Optimized dispersions also can be determined.

The embodiments of FIGS. 1-4 can include a feedback operation in between the steps. The feedback can include learning by matching measured and simulated signals or feedback on the goodness of the current anisotropic dispersion models. These can be calculated to decide appropriate adjustments on the initial dispersion models.

Small-sized semiconductor or metal components of nanostructures, such as those in FinFETs or GAA FETs, are disclosed as example structures that can be measured using embodiments disclosed herein. FIG. 5 illustrates an exemplary film stack of alternating Si and SiGe layers with a $SiO_2$ layer on top. FIG. 6 illustrates an exemplary FinFET. FIG. 7 illustrates an exemplary GAA FET. In FIG. 7, the structures are made of Si, $SiO_2$, and SiN, respectively. Other structures besides those in FIGS. 5-7 are possible, and the structures of FIGS. 5-7 are merely examples.

Embodiments disclosed herein can be used for optical critical dimension (CD) measurement.

FIG. 5 is a block diagram of an embodiment of a wafer metrology tool 500. The wafer metrology tool 500 includes a chuck 504 configured to hold a wafer 505 or other workpiece. The chuck 504 may be configured to move or rotate in one, two, or three axes. The chuck 504 also may be configured to spin, such as around the Z-axis.

The wafer metrology tool 500 also includes a measurement system 501 configured to measure part of a surface, a device, a feature, or a layer on the wafer 505. The measurement system 501 may produce a beam of light, a beam of electrons, broad band plasma, or may use other techniques to measure a surface of the wafer 505. In one example, the measurement system 501 includes a laser. In another example, the wafer metrology tool 500 is a broad-band plasma inspection tool. The measurement system 501 can provide images of dies on the wafer 505 or can provide information used to form images of dies on the wafer 505.

In particular, the wafer metrology tool 500 or measurement system 501 can be configured to provide one or more of rotating polarizer rotating compensator spectroscopic ellipsometry data, full Muller matrix components data, rotating polarizer spectroscopic ellipsometry data, reflectometry data, laser driven spectroscopic reflectometry data, or X-ray data.

In an instance, the wafer metrology tool 500 provides SE using a broadband light source, a measurement system 501 that measures how the light source interacts with the target, and processing algorithms that extract the relevant parameters of the target. The source might be a laser driven light source, which can provide high intensities and increase the signal-to-noise ratio at the detector, as opposed to a Xe lamp. In an example, the collection system includes a series of polarizers (rotating or fixed), compensators (rotating or fixed), detectors, spectrometers, cameras, lenses, mirrors, and/or collimators. To enhance target signatures, the system may use $N_2$ or Ar gas purge to extend the wavelength range to 170 nm or below.

The wafer metrology tool 500 communicates with a processor 502 and an electronic data storage unit 503 in electronic communication with the processor 502. For example, the processor 502 can communicate with the measurement system 501 or other components of the wafer metrology tool 500. The processor 502 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 502 to implement various methods and functions may be stored in controller readable storage media, such as a memory in the electronic data storage unit 503, within the processor 502, external to the processor 502, or combinations thereof.

While only one processor 502 and electronic data storage unit 503 are illustrated, more than one processor 502 and/or more than one electronic data storage unit 503 can be included. Each processor 502 may be in electronic communication with one or more of the electronic data storage units 503. In an embodiment, the one or more processors 502 are communicatively coupled. In this regard, the one or more processors 502 may receive readings received at the measurement system 501 and store the reading in the electronic data storage unit 503 of the processor 502. The processor 502 and/or electronic data storage unit 503 may be part of the system itself or may be separate from the system (e.g., a standalone control unit or in a centralized quality control unit).

The processor 502 may be coupled to the components of the wafer metrology tool 500 in any suitable manner (e.g., via one or more transmission media, which may include wired and/or wireless transmission media) such that the processor 502 can receive the output generated by the wafer metrology tool 500, such as output from the measurement system 501. The processor 502 may be configured to perform a number of functions using the output. For instance, the processor 502 may be configured to measure layers on the wafer 505. In another example, the processor 502 may be configured to send the output to an electronic data storage unit 503 or another storage medium without reviewing the output. The processor 502 may be further configured as described herein.

In an instance, the processor 502 and the electronic data storage unit 503 are part of the wafer metrology tool 500. The processor 502 and the electronic data storage unit 503 also may be part of a separate unit from the wafer metrology tool 500.

The processor 502, other system(s), or other subsystem(s) described herein may take various forms, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool. For example, the processor 502 may include a microprocessor, a microcontroller, or other devices.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 502 also may be part of a defect review system, an inspection system, a metrology system, or some other type of system. Thus, the embodiments disclosed herein describe some configurations that can be tailored in a number of manners for systems having different capabilities that are more or less suitable for different applications.

The processor 502 may be in electronic communication with the measurement system 501 or other components of the wafer metrology tool 500. The processor 502 may be configured according to any of the embodiments described herein. The processor 502 also may be configured to perform other functions or additional steps using the output of the measurement system 501 or using images, measurements, or data from other sources.

Figure 8:
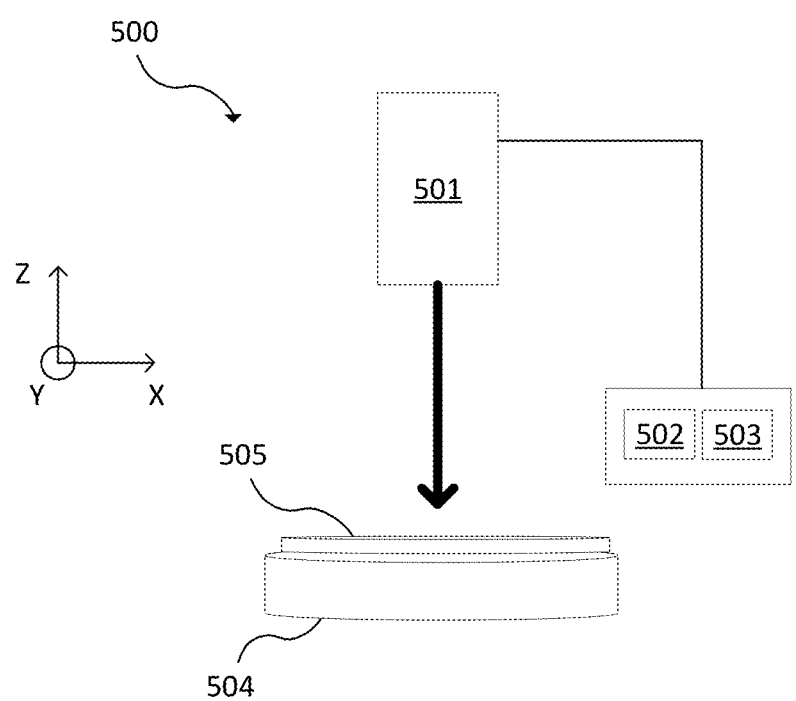
FIG. 8 is a block diagram of a system in accordance with the present disclosure.

An additional embodiment relates to a non-transitory computer-readable medium storing program instructions executable on a controller for performing a computer-implemented method, as disclosed herein. In particular, as shown in FIG. 8, the processor 502 can include a memory in the electronic data storage unit 503 or other electronic data storage medium with non-transitory computer-readable medium that includes program instructions executable on the processor 502. The computer-implemented method may include any step(s) of any method(s) described herein. For example, the processor 502 may be programmed to perform some or all of the steps of one or more of FIGS. 1-4. The memory in the electronic data storage unit 503 or other electronic data storage medium may be a storage medium such as a magnetic or optical disk, a magnetic tape, or any other suitable non-transitory computer-readable medium known in the art.

In an embodiment, a simulator is provided. The simulator may be operated on a processor, such as the processor 502 in FIG. 8. The simulator includes a parameterized geometric model of a structure, such as one based on spectra. The spectra can be from an area of a semiconductor wafer that includes a structure and can be measured by a wafer metrology tool. The structure has geometry-induced anisotropic effects. The parameterized geometric model is configured to have anisotropic material properties assigned; determine dispersion parameters of the structure on the wafer; determine at least one of geometric parameters or anisotropic material parameters; and predict anisotropic dispersions based on the spectra. The dispersion parameters include anisotropic dispersion parameters.

In an instance, the processor 502 can be configured to execute one or more software modules. The one or more software modules generate a parameterized geometric model of a structure, such as based on spectra. The spectra can be from an area of a semiconductor wafer that includes a structure and can be measured by a wafer metrology tool. The structure has geometry-induced anisotropic effects. The one or more software modules can assign anisotropic material properties to the parameterized geometric model; determine dispersion parameters of the structure on the wafer using the parameterized geometric model; and determine at least one of geometric parameters or anisotropic material parameters from the parameterized geometric model. The dispersion parameters include anisotropic dispersion parameters.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In another embodiment, the processor 502 may be communicatively coupled to any of the various components or sub-systems of wafer metrology tool 500 in any manner known in the art. Moreover, the processor 502 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 502 and other subsystems of the wafer metrology tool 500 or systems external to wafer metrology tool 500.

In some embodiments, various steps, functions, and/or operations of wafer metrology tool 500 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape and the like. A carrier medium may include a transmission medium such as a wire, cable, or wireless transmission link. For instance, the various steps described throughout the present disclosure may be carried out by a single processor 502 (or computer system) or, alternatively, multiple processors 502 (or multiple computer systems). Moreover, different sub-systems of the wafer metrology tool 500 may include one or more computing or logic systems. Therefore, the above description should not be interpreted as a limitation on the present disclosure, but merely an illustration.

In an instance, the wafer metrology tool 500 in FIG. 8 may include an illumination system which illuminates a target; a measurement system 501 which captures relevant information provided by the illumination system's interaction (or lack thereof) with a target, device, or feature on the wafer 505; and a processor 502 which analyzes the information collected using one or more algorithms.

The wafer metrology tool 500 can include one or more hardware configurations which may be used to measure the various semiconductor structural and material characteristics. Examples of such hardware configurations include, but are not limited to, a spectroscopic ellipsometer (SE); an SE with multiple angles of illumination; an SE measuring Mueller matrix elements (e.g., using rotating compensator (s)); a single-wavelength ellipsometers; a beam profile ellipsometer (angle-resolved ellipsometer); a beam profile reflectometer (angle-resolved reflectometer); a broadband reflective spectrometer (spectroscopic reflectometer); a single-wavelength reflectometer; an angle-resolved reflectometer; an imaging system; or a scatterometer (e.g., speckle analyzer). The hardware configurations can be separated into discrete operational systems or can be combined into a single tool.

The illumination system of certain hardware configurations can include one or more light sources. The light source may generate light having only one wavelength (i.e., monochromatic light), light having a number of discrete wavelengths (i.e., polychromatic light), light having multiple wavelengths (i.e., broadband light), and/or light the sweeps through wavelengths, either continuously or hopping between wavelengths (i.e., tunable sources or swept source). Examples of suitable light sources are: a white light source, an ultraviolet (UV) laser, an arc lamp or an electrode-less lamp, a laser sustained plasma (LSP) source, a supercontinuum source such as a broadband laser source, shorter-wavelength sources such as X-ray sources, extreme UV sources, or some combination thereof. The light source may also be configured to provide light having sufficient brightness, which in some cases may be a brightness greater than about 1 W/(nm cm$^2$ Sr). The wafer metrology tool 203 may also include a fast feedback to the light source for stabilizing its power and wavelength. Output of the light source can be delivered via free-space propagation, or in some cases delivered via optical fiber or light guide of any type.

The wafer metrology tool 500 may be designed to make many different types of measurements related to semiconductor manufacturing. For example, in certain embodiments the wafer metrology tool 500 may measure characteristics of one or more targets, such as critical dimensions, overlay, sidewall angles, film thicknesses, or process-related parameters (e.g., focus and/or dose). The targets can include certain regions of interest that are periodic in nature, such as gratings in a memory die. Targets can include multiple layers (or films) whose thicknesses can be measured by the wafer metrology tool 500. Targets can include target designs placed (or already existing) on the semiconductor wafer for use, such as with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools. The data from such measurements may be combined. Data from the metrology tool is used in the semiconductor manufacturing process, for example, to feed-forward, feed-backward and/or feed-sideways corrections to the process (e.g., lithography, etch) and, therefore, can yield a complete process control solution.

Collected data can be analyzed by a number of data fitting and optimization techniques and technologies including: libraries; fast-reduced-order models; regression; machine-learning algorithms such as neural networks and support-vector machines (SVM); dimensionality-reduction algorithms such as principal component analysis (PCA), independent component analysis (ICA), and local-linear embedding (LLE); sparse representation such as Fourier or wavelet transform; Kalman filter; algorithms to promote matching from same or different tool types, and others. Collected data can also be analyzed by algorithms that do not include modeling, optimization and/or fitting.

Computational algorithms are usually optimized for metrology applications with one or more approaches being used such as design and implementation of computational hardware, parallelization, distribution of computation, load-balancing, multi-service support, or dynamic load optimization. Different implementations of algorithms can be done in firmware, software, field programmable gate array (FPGA), and programmable optics components, etc.

The data analysis and fitting steps usually pursue one or more goals. For example, the goal may be measurement of CD, sidewall angle (SWA), shape, stress, composition, films, bandgap, electrical properties, focus/dose, overlay, generating process parameters (e.g., resist state, partial pressure, temperature, and focusing model), and/or any combination thereof. The goal may be modeling and/or design of metrology systems. The goal also may be modeling, design, and/or optimization of metrology targets.

Embodiments of the present disclosure address the field of semiconductor metrology and are not limited to the hardware, algorithm/software implementations and architectures, and use cases summarized above.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
receiving spectra at a processor, wherein the spectra are from an area of a semiconductor wafer that includes a structure, wherein the spectra are measured by a wafer metrology tool, and wherein the structure has geometry-induced anisotropic effects;
generating a parameterized geometric model of the structure using the processor;
assigning anisotropic material properties to the parameterized geometric model using the processor;
determining dispersion parameters of the structure on the wafer using the parameterized geometric model with the processor, wherein the dispersion parameters include anisotropic dispersion parameters, and wherein anisotropic dielectric components of the dispersion parameters are provided by one or more reference theoretical or empirical dispersion models; and
determining at least one geometric parameter or anisotropic material parameter from the parameterized geometric model using the processor.

2. The method of claim 1, further comprising measuring the spectra with the wafer metrology tool.

3. The method of claim 1, wherein the dispersion parameters include an anisotropic tensor matrix.

4. The method of claim 1, wherein the reference theoretical or empirical dispersion models represent dependency of the dispersion parameters on contributing factors to anisotropy.

5. The method of claim 1, wherein the at least one geometric parameter or anisotropic material parameter is determined using a regression.

6. The method of claim 1, wherein the at least one geometric parameter or anisotropic material parameter is determined using machine learning.

7. The method of claim 1, wherein the dispersion parameters are modeled using a biaxial model or a uniaxial model.

8. The method of claim 7, wherein dielectric components of the biaxial model or the uniaxial model are provided by at least one reference dispersion model.

9. The method of claim 1, wherein the anisotropic material properties include at least one of electron density, material density, or chemical composition.

10. The method of claim 1, wherein the anisotropic dispersion parameters are parametrized using correction parameters.

11. The method of claim 10, wherein the correction parameters represent shifts or scales of an original anisotropic dispersion.

12. The method of claim 1, wherein the dispersion parameters are determined by a process including:
generating a spectral design of experiments using the parameterized geometric model, a dispersion model, and a simulator, wherein at least one of the geometric parameters and dispersion parameters are distributed within predetermined ranges;
training a statistical model to determine a relationship between the spectra and at least one parameter related to geometric and/or material parameters of the structure; and
predicting parameters of interest of the structure from the spectra using the statistical model.

13. The method in claim 1, wherein the dispersion parameters are determined by at least one of optimization or regression minimizing a spectral difference between modeled and measured versions of the spectra and by perturbing the parameterized geometric model and the dispersion parameters.

14. The method in claim 1, further comprising one or more feedback operations that use learning based upon comparing simulated spectra and the spectra to adjust parameters in the parameterized geometric model, a dispersion model, and/or a geometric configuration.

15. The method of claim 1, further comprising predicting anisotropic dispersions using the spectra.

16. A computer program product comprising a non-transitory computer readable storage medium having a computer readable program embodied therewith, the computer readable program configured to carry out the method of claim 1.

17. A system comprising:
an electronic data storage unit; and
a processor in electronic communication with the electronic data storage unit and a wafer metrology tool, wherein the processor is configured to:
generate a parameterized geometric model of a structure, wherein the spectra are from an area of a semiconductor wafer that includes a structure, wherein the spectra are measured by a wafer metrology tool, and wherein the structure has geometry-induced anisotropic effects;

assign anisotropic material properties to the parameterized geometric model;

determine dispersion parameters of the structure on the wafer using the parameterized geometric model, wherein the dispersion parameters include anisotropic dispersion parameters, and wherein anisotropic dielectric components of the dispersion parameters are provided by one or more reference theoretical or empirical dispersion models; and determine at least one geometric parameter or anisotropic material parameter from the parameterized geometric model.

18. The system of claim 17, wherein the processor and the electronic data storage unit are disposed in the wafer metrology tool.

19. A non-transitory computer-readable storage medium, comprising one or more programs for executing a simulator comprising:

a parameterized geometric model of a structure, wherein the spectra are from an area of a semiconductor wafer that includes a structure, wherein the spectra are measured by a wafer metrology tool, wherein the structure has geometry-induced anisotropic effects, and wherein the parameterized geometric model, using a processor, is configured to:

have anisotropic material properties assigned;

determine dispersion parameters of the structure on the wafer, wherein the dispersion parameters include anisotropic dispersion parameters, and wherein anisotropic dielectric components of the dispersion parameters are provided by one or more reference theoretical or empirical dispersion models;

determine at least one geometric parameter or anisotropic material parameter; and predict anisotropic dispersions based on the spectra.

20. The system of claim 17, wherein the dispersion parameters are determined by a process including:

generating a spectral design of experiments using the parameterized geometric model, a dispersion model, and a simulator, wherein at least one of the geometric parameters and dispersion parameters are distributed within predetermined ranges;

training a statistical model to determine a relationship between the spectra and at least one parameter related to geometric and/or material parameters of the structure; and predicting parameters of interest of the structure from the spectra using the statistical model.

* * * * *